United States Patent [19]

Nokubo

[11] Patent Number: 5,218,244
[45] Date of Patent: Jun. 8, 1993

[54] LOGIC LEVEL CONVERTER CIRCUIT
[75] Inventor: Jyoji Nokubo, Tokyo, Japan
[73] Assignee: NEC Corporation, Tokyo, Japan
[21] Appl. No.: 841,803
[22] Filed: Feb. 26, 1992
[30] Foreign Application Priority Data
Feb. 26, 1991 [JP] Japan .................. 3-53935
[51] Int. Cl.[5] .......................................... H03K 19/01
[52] U.S. Cl. ................................ 307/446; 307/443; 307/455; 307/475
[58] Field of Search ............... 307/443, 446, 455, 475, 307/246, 570

[56] References Cited

U.S. PATENT DOCUMENTS

| | | | |
|---|---|---|---|
| 4,999,519 | 3/1991 | Kitsukawa et al. .................. | 307/446 |
| 5,027,013 | 6/1991 | Coy et al. .............................. | 307/475 |
| 5,073,728 | 12/1991 | Ovens ..................................... | 307/455 |
| 5,124,581 | 6/1992 | Umeki .................................... | 307/446 |
| 5,146,116 | 9/1992 | Sugimoto ......................... | 307/443 X |

*Primary Examiner*—David R. Hudspeth
*Attorney, Agent, or Firm*—Sughrue, Mion, Zinn, Macpeak & Seas

[57] ABSTRACT

A logic level converter circuit for converting an ECL input signal to other type logic signal such as a TTL output signal comprises a differential comparator of an ECL type and an inverter which is formed by an output insulated-gate field-effect transistor and an output bipolar transistor connected in series between a higher potential power supply terminal and a lower potential power supply terminal. An output node of the differential comparator is directly connected to a gate of the output field-effect transistor and also coupled through a coupling capacitor to a base of the output bipolar transistor. An output of the differential comparator may be supplied to both the output transistors through an emitter follower circuit having a high driving capability. A bias voltage generating circuit may be provided for causing a DC bias current to flow in the output bipolar transistor. A change in the differential comparator output is immediately transmitted not only to the output field-effect transistor but also to the output bipolar transistor, so that it is possible to reduce the propagation delay time and to increase the operation speed of the circuit.

8 Claims, 3 Drawing Sheets

LOGIC LEVEL CONVERTER CIRCUIT

BACKGROUND OF THE INVENTION (1) Field of the Invention

The present invention relates to a logic level converter circuit for converting an ECL (emitter-coupled logic) level signal into a TTL (transistor transistor logic) level signal or a CMOS (complementary MOS transistor) logic level signal and, more particularly, to a logic level converter circuit utilizing Bipolar-CMOS (BiCMOS) techniques.

(2) Description of the Related Art

A typical example of a conventional logic level converter circuit utilizing BiCMOS techniques, to which the present invention relates, in shown in FIG. 1. This circuit comprises a differential comparator 10 including a pair of differential NPN-type bipolar transistors Q1, Q2, and a P-channel MOS transistors (hereinafter referred to as "PMOS transistors") T1, T2 whose gates receive from the differential comparator the signals of an in-phase (truth) and an opposite phase (false) with respect to an input signal, respectively, and a current-mirror circuit including N-channel MOS transistors (hereinafter referred to as "NMOS transistors") T3, T4 connected to the drains of the PMOS transistors T1, T2, respectively.

The above conventional logic level converter circuit operates as follows. When an ECL input signal $V_{IN}$ applied to the base of the bipolar transistor Q1 becomes a high level with respect to a reference voltage $V_{REF}$ applied to the base of the bipolar transistor Q2, the transistor Q1 turns on and the transistor Q2 turns off. As a result, a voltage drop is developed across a load resistor R1 so as to drive the gate of the PMOS transistor T1 to a low level voltage, thus turning on the PMOS transistor T1. To the contrary, no voltage drop generates across a load resistor R2 connected to the collector of the transistor Q2. Therefore, the gate of the PMOS transistor T2 is held at the high level voltage of a power source voltage $V_{CC}$, so that the PMOS transistor T2 is at an off-state. Through the transistor T1, a high level voltage is applied to the gates of the NMOS transistors T3, T4, and an output $V_{OUT}$ appearing at an output node $T_{OUT}$ becomes a GND (ground potential) level because the NMOS transistor T4 is turned on and PMOS transistor T2 is turned off.

On the other hand, when the input signal $V_{IN}$ becomes a low level voltage which is lower than the $V_{REF}$ voltage, the PMOS transistor T2 turns on and the PMOS transistor T4 turns off. As a result, the output $V_{OUT}$ at the output node $T_{OUT}$ becomes a high level whose voltage is approximate to the power source voltage $V_{CC}$.

In this way, the conventional logic level converter circuit shown in FIG. 1 performs a level conversion such that it provides a CMOS level as its output $V_{OUT}$ depending on whether the ECL level input $V_{IN}$ is at a high level or a low level. In FIG. 1, the symbol I1 represents a constant-current source connected between the ground and the common emitters of the transistors Q1, Q2, the numeral 20 represents a BiCMOS gate which receives the output $V_{OUT}$ of the logic level converter circuit, and the symbol $V_{OT}$ represents an output voltage of the BiCMOS gate 20.

This logic level converter circuit shown in FIG. 1 uses the PMOS transistor T2 and the NMOS transistors T4 as output drivers for the output $V_{OUT}$. In the case where the output $V_{OUT}$ changes its voltage from the low to high level, a fast operation is achieved because the gate of the output PMOS transistors T2 is driven directly by the voltage drop developed across the load resistor R2 in the differential comparator 10. However, in the case where it changes from the high to low level, the voltage drop across the load resistor R1 is once received by the inverter constituted by the PMOS and NMOS transistors T1, T3 before being applied to the gate of the output NMOS transistor T4. In this case, therefore, there inevitably occurs undesirable and long propagation delay time. This is a problem to be solved in the conventional circuit.

SUMMARY OF THE INVENTION

It is, therefore, an object of the invention to solve the problems existing in the conventional circuit and to provide an improved logic level converter circuit in which the propagation delay time noted above is effectively reduced.

According to the present invention, there is provided a logic level converter circuit for converting an ECL level signal to other logic type level signal such as a TTL level signal or CMOS logic level signal, which comprises:

a higher and a lower potential power supply terminal;

a differential comparator including a differential pair of first and second bipolar transistors whose emitters are connected together, for outputting an output at an output node; and a level conversion means for converting the output of the comparator from the ECL level signal to other logic type level signal.

the level conversion means including an inverter and a capacitor, the inverter having an insulated-gate field-effect transistor whose gate is connected to the output node of the differential comparator and a third bipolar transistor connected in series with the insulated-gate field-effect transistor, the inverter being disposed between the higher and lower potential power supply terminals, and the capacitor being connected between the output node of the differential comparator and a gate of the third bipolar transistor.

The level converter circuit according to the invention may further comprise a bias voltage generating circuit connected to the base of the third bipolar transistor to cause a predetermined steady-state DC current to flow therein.

The level converter circuit according to the invention may further comprise a first emitter follower circuit including a fourth bipolar transistor and having an input node connected to the output node of the differential comparator and an output node connected to the gate of the first insulated-gate FET.

The level converter circuit according to the invention may further comprise a second emitter follower circuit including a fifth bipolar transistor and having an input node connected to the one end of the capacitor and an output node connected to the base of the third bipolar transistor.

The inverter circuit, which effects the level conversion, comprises, for instance, a PMOS transistor and an NPN-type bipolar transistor connected in series between the power supply source and the ground, and the output node of the comparator is not only connected directly to the gate of the output PMOS transistor but also coupled through a capacitor to the base of the output bipolar transistor. Thus, a change in the differential comparator output is immediately transmitted not only to the PMOS transistor but also to the bipolar transistor. It is thus possible to reduce the delay time.

Further, the delay time may further be reduced by causing a small amount of DC current not adversely affecting the operation of the circuit to constantly or continuously flow through the output bipolar transistor so as to improve the rising characteristics.

The increase in the operation speed of the bipolar transistor and still further the reduction of the delay time can be achieved by coupling the output of the differential comparator through a first emitter follower circuit having a high driving capability to the inverter and also coupling the output of the capacitor through a second emitter follower circuit to the base of the output bipolar transistor.

BRIEF DESCRIPTION OF THE DRAWINGS

The above and other objects, features and advantages of the invention will become more apparent from the following description of the preferred embodiments thereof when the same is read with reference to the accompanying drawings, in which.

PREFERRED EMBODIMENTS OF THE INVENTION

Figure 1:
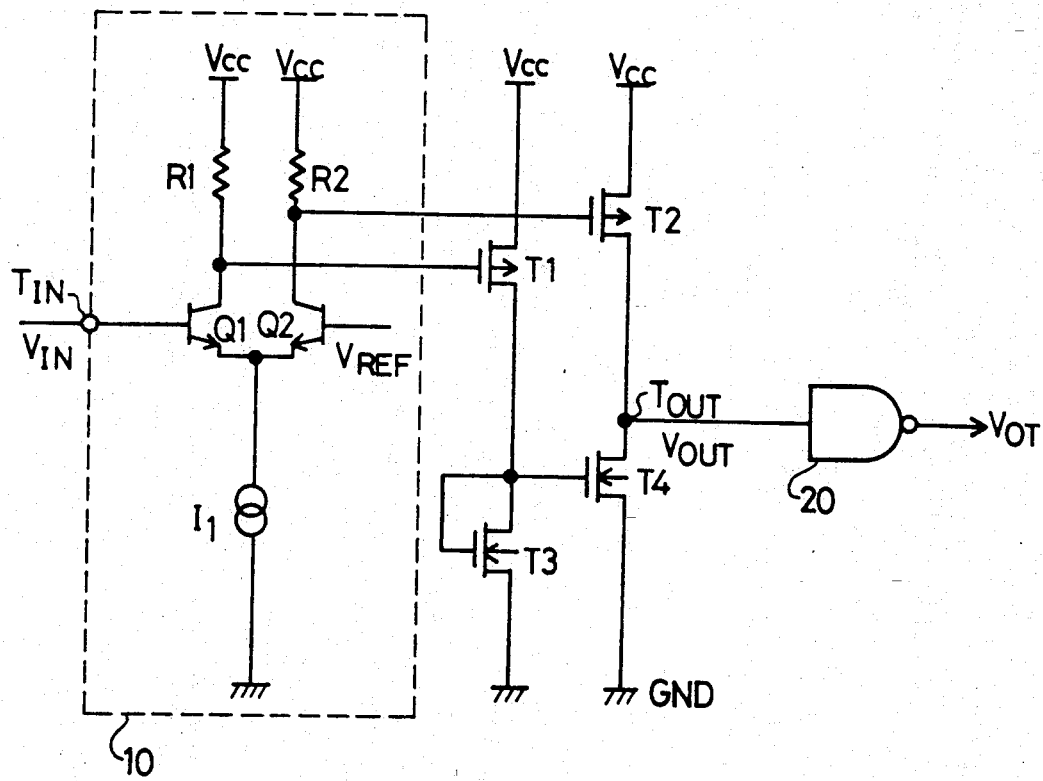
FIG. 1 is a circuit diagram showing a conventional logic level converter circuit.

Now, preferred embodiments of the invention will be described with reference to the accompanying drawings. It is to be noted that the reference numerals or symbols used for the conventional circuit shown in FIG. 1 are also used for the explanation and drawings of the invention for the same or like elements.

Figure 2:
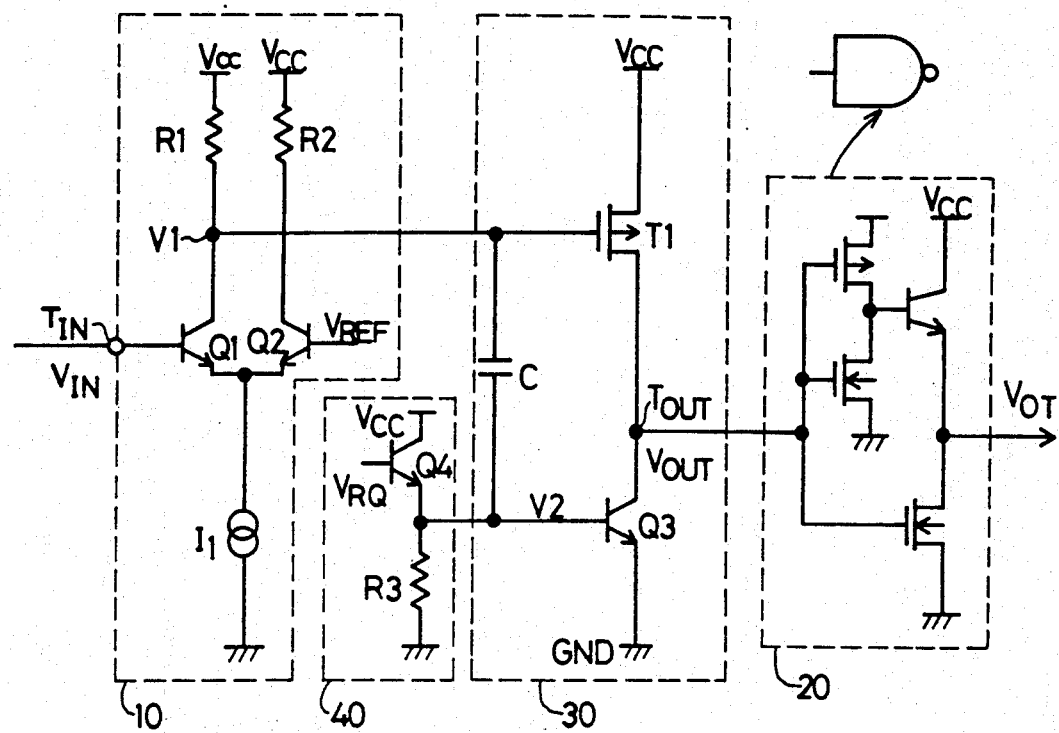
FIG. 2 is a circuit diagram showing a first embodiment of a logic level converter circuit according to the invention.

FIG. 2 shows a first embodiment of the logic level converter circuit of the invention, which comprises a differential comparator 10 composed of a differential amplifier of a first and second NPN-type bipolar transistors Q1, Q2 whose emitters are connected in common to the ground GND through a constant-current source I1. The first NPN-type bipolar transistor Q1 has its base connected to an input terminal $T_{IN}$ and its collector connected to a power supply source $V_{CC}$ through a load resistor R1. The second NPN-type bipolar transistor Q2 has its base connected to a reference voltage source $V_{REF}$ of the ECL logic level and its collector connected to the power supply source $V_{CC}$ through a load resistor R2.

One of the features of the invention resides in that the logic level converter circuit comprises an inverter circuit 80 which includes a PMOS transistor T1 as a first insulated-gate field effect transistor, having its source connected to the power supply source $V_{CC}$ and its gate connected to the collector of the bipolar transistor Q1 of the differential comparator 10 and its voltage is V1, and a third NPN-type bipolar transistor Q3 having its collector connected to the drain of the PMOS transistor T1, its emitter connected to the ground GND and its base coupled to the output node T1 of the differential comparator 10 through a coupling capacitor C. The output $V_{OUT}$ of the inverter 30 is derived from a common junction node, that is, an output node $T_{OUT}$ defined between the drain of the PMOS transistor T1 and the collector of the bipolar transistor Q3. Another feature of the invention resides in that the logic level converter circuit may further comprise a bias voltage generating circuit 40 which is formed by an NPN-type bipolar transistor Q4 having its collector connected to the power supply source $V_{CC}$, its base connected to a reference voltage source $V_{RQ}$ and its emitter connected to the ground GND through a load resistor R3 and also connected to the base of the output NPN-type bipolar transistor Q3.

The output $V_{OUT}$ of the inverter 30 is connected to the input of the BiCMOS gate 20 which outputs an output signal $V_{OT}$.

The operation of this embodiment will now be described hereunder.

When an ECL level signal $V_{IN}$ applied to the base of the bipolar transistor Q1 becomes a high level voltage which is higher than the reference voltage $V_{REF}$ applied to the base of the bipolar Q2, the transistor Q1 turns on and the transistor Q2 turns off. The output voltage V1 of the differential comparator 10 is developed across the load resistor R1. The voltage value of the output V1 is determined as $R1 \times I1$ (R1 being the resistance value of the resistor R1, and I1 being the current value of the constant-current source I1), and is usually set to about 1.5 V. The value of 1.5 V is sufficiently larger than the threshold value of the PMOS transistor T1 of the next stage. The output stage is formed by the PMOS transistor T1 and the bipolar transistor Q3 connected in series with each other. The base of the bipolar transistor Q3 is supplied with a bias voltage from the bias voltage generating circuit 40 to cause a predetermined constant current to flow from the collector of the bipolar transistor Q3. This constant current is set to a value suitable to hold the nullbalanced logical level condition of the output $V_{OUT}$, and is preferably about 100 μA. The output voltage V1 of the differential comparator 10 directly drives the gate of the PMOS transistor T1 and also drives the base of the bipolar transistor Q3 through the coupling capacitor C.

Here, it is assumed that the output V1 of the differential comparator 10 is at a low level. This low level voltage which is ($V_{CC} - R1 \times I1$) is applied to the gate of the PMOS transistor T1, and the PMOS transistor T1 turns on. Since on-resistance of the PMOS transistor T1 is set to a value of 1 KΩ or below and, as above mentioned, the constant current of the bipolar transistor Q4 is about 100 μA, the output voltage $V_{OUT}$ becomes about 4.9 V ($\approx 5$ V $-100$ μA $\times 1$ KΩ) and is a high level voltage of BiCMOS logic.

Next, when the input $V_{IN}$ becomes a low level voltage which is lower than the $V_{REF}$ level voltage, the output V1 of the differential comparator 10 subsequently turns to a high level, and the PMOS transistor T1 is immediately turned off, and the output $V_{OUT}$ starts the transition to the low level.

Under this state, if no capacitance C shown in FIG. 2 is provided, the voltage of the output $V_{OUT}$ goes down in accordance with a time constant which is determined by the steady-state current of 100 μA flowing through the bipolar transistor Q3 and the parasitic capacitance at the output node $T_{OUT}$. Assuming that the parasitic capacitance is 0.5 pF, the time required for lowering of the output voltage to the threshold voltage of 2.5 V of the next stage BiCMOS gate 20 has a very large value of $(4.9 \text{ V} - 2.5 \text{ V}) \times 0.5 \text{ pF}/ 0.1 \mu\text{A} = 12$ nsec.

Figure 3:
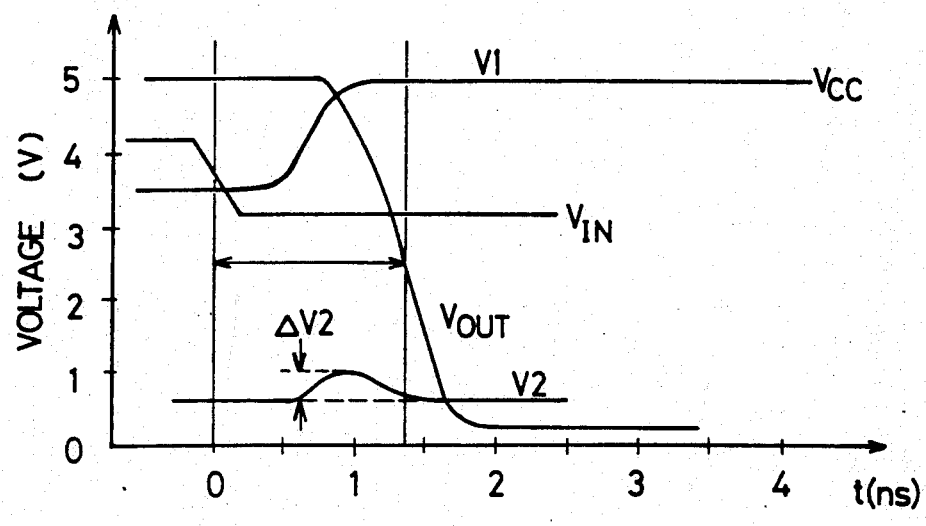
FIG. 3 is a waveform diagram for illustrating the operation of the embodiment shown in FIG. 2.

Now, the operation in the case where the capacitor C is present as shown in FIG. 2 will be described with reference to FIG. 3. Referring to FIG. 3, where the input $V_{IN}$ of an ECL level signal changes from the high to low level, the output V1 of the differential comparator 10 rises from the low level voltage of the high level voltage. The base voltage V2 of the bipolar transistor Q3 follows the change in the output V1 though the coupling capacitance C and is increased to (V2+$\Delta$V2), and the collector current of the bipolar transistor Q3 is increased. On the assumption that the total parasitic capacitance at the base terminal of the bipolar transistor Q3 excluding the capacitance C is $C_0$ and also that C=0.2 pF and $C_0$=1 pF, it can be expected that $\Delta$V2 is about $\Delta V2 = V1 \times C/(C+C_0) \approx 1.5 \text{ V} \times 0.2 \text{ pF}/(0.2 \text{ pF} + 1 \text{ pF}) \neq 0.25$ V. The base voltage V2 of the bipolar transistor Q3 in the actual steady-state operation is about 0.65 V when the operating current is 100 $\mu$A, but in the above explained transition state the base voltage V2 rises up to 0.9 V (=0.65 V —0.25 V). Generally, the relation between the base-emitter voltage $V_{BE}$ and the collector current $I_C$ is such that a change in $V_{BE}$ by 70 mV results in 10 times changes in the collector current $I_C$. Thus, the voltage change by 250 mV results in an increase in the collector current by about $10^{3.5}$ (3.5$\approx$250 mV/70 mV), i.e., approximatley 1,000 times.

However, in the actual operation, it is necessary to supply the base current to the bipolar transistor Q3 and also to the resistor R3. Therefore, the change in $\Delta$V2 is 70 mW~100 mV, and the change in the collector current at this time can be made to be 10~20 times, that is, 1 mA (=100 $\mu$A$\times$10 )~2 mA(=100 $\mu$A$\times$20). Thus, the time required for the lowering of the output $V_{OUT}$, as calculated in the above manner, can be greatly shortened to (4.9 V—2.5 V)$\times$0.5 pF/(1 mA~2 mA)=1.2 nsec~0.6 nsec.

Figure 4:
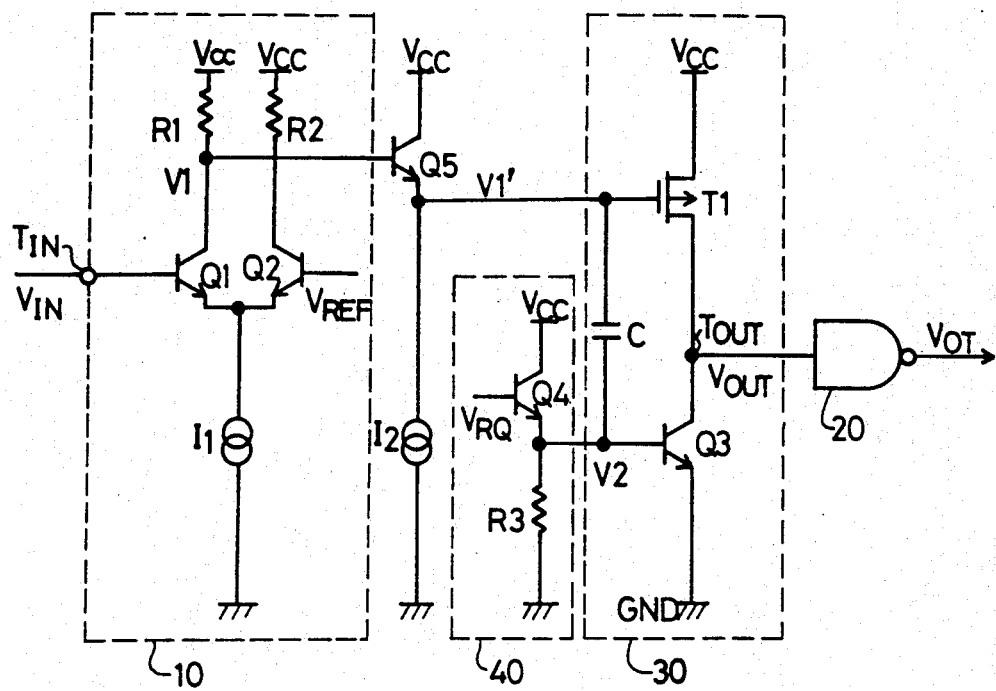
FIG. 4 is a circuit diagram showing a second embodiment of a logic level converter circuit according to the invention.

FIG. 4 shows a circuit diagram of a second embodiment according to the invention. In this embodiment, the output voltage V1 developed across the load resistor R1 in the differential comparator 10 drives the first emitter follower circuit. This first emitter follower circuit is formed by a fourth NPN-type bipolar transistor Q5 having a collector connected to the power supply source $V_{CC}$, a base connected to the collector of the transistor Q1 of the differential comparator 10, and an emitter connected to the ground GND through a constant-current source I2. The output voltage V1 drives the base of the fourth NPN-type bipolar transistor Q5 and the emitter voltage V1' drives the gate of the PMOS transistor T1 and also the coupling capacitor C with a high driving capability.

The coupling capacitor C can be driven more quickly by the emitter follower circuit having a higher driving capability, so that the operation speed can be increased accordingly.

Figure 5:
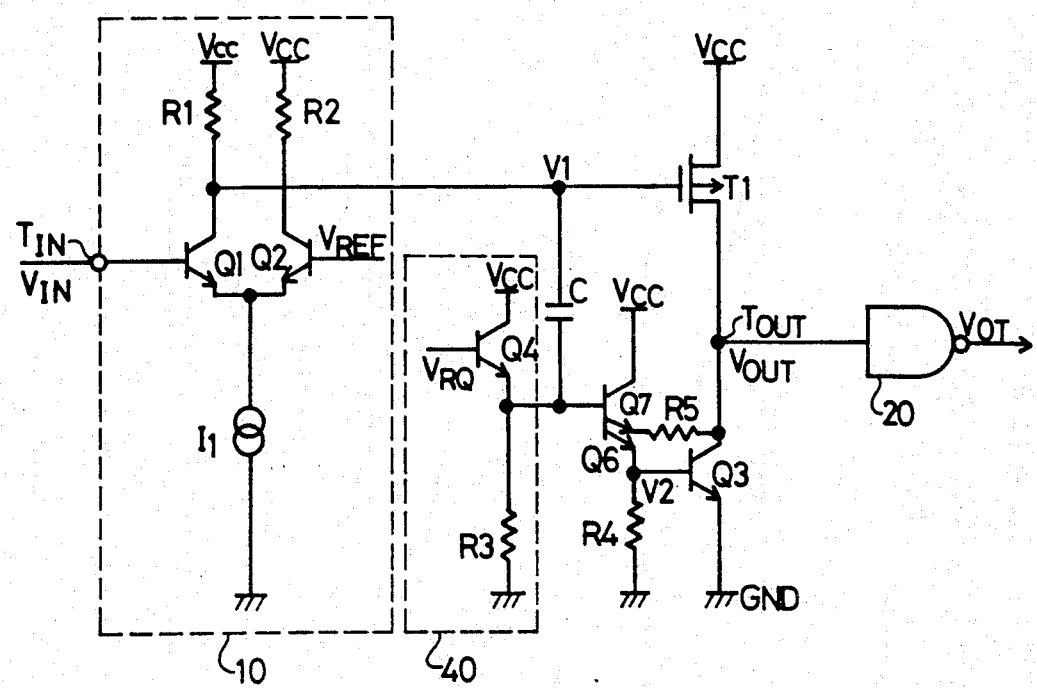
FIG. 5 is a circuit diagram showing a third embodiment of a level converter circuit according to the invention.

FIG. 5 shows a circuit diagram of a third embodiment according to the invention. This third embodiment features the provision, in addition to the circuit configuration of the first embodiment shown in FIG. 2, of a second emitter follower circuit having a high driving capability which drives the base of the output bipolar transistor Q3. This second emitter follower circuit is formed by a fifth NPN-type bipolar transistor Q5 having a collector connected to the power supply source $V_{CC}$, a base connected to one end of the capacitor C and also to the emitter of the bipolar transistor Q4 of the bias voltage generating circuit 40, and an emitter connector to the ground GND through a load resistor R4. The NPN-type bipolar transistor Q6 may well be a double-emitter type transistor Q7 whose one emitter is connected to the ground GND through the load resistor R4 and whose the other emitter is connected to the collector of the output bipolar transistor Q3 through a resistor R5, so that the double-emitter type transistor Q7 is used as a clamping bipolar transistor.

In this third embodiment, since the base current to the bipolar transistor Q3 is supplied through the bipolar transistor Q5, and it is not necessary to supply a large base current to the bipolar transistor Q3 through the coupling capacitor C directly, the level changes in the output voltage V1 of the differential comparator 10 can be effectively transmitted as the base voltage V2 applied to the bipolar transistor Q3. The operation speed thus can be further increased.

While in the above embodiments a MOS transistor is used as an insulated-gate FET, it is also possible to use other type insulated-gate FETs.

As has been described in the foregoing, according to the invention, the collector current in the output bipolar transistor constituting the inverter circuit is increased transiently by supplying the output of the differential comparator through the coupling capacitor to the base of this output bipolar transistor. It is thus possible to permit quick falling of the output voltage, whereby the propagation delay time is effectively shortened.

While the invention has been described in its preferred embodiments, it is to be understood that the words which have been used are words of description rather than limitation and that changes within the purview of the appended claims may be made without departing form the true scope and spirit of the invention in its broader aspects.

What is claimed is:

1. A logic level converter circuit for converting an ECL level signal to other logic type level signal, said circuit comprising:
   a first and a second power supply terminal;
   a differential comparator including a differential pair of first and second bipolar transistors whose emitters are connected together, for outputting an output at an output node; and
   a level conversion means for converting the output of said differential comparator from said ECL level signal to said other logic type level signal.
   said level conversion means including an inverter and a capacitor, said inverter having an insulated-gate field-effect transistor whose gate is connected to said output node of said differential comparator and a third bipolar transistor connected in series with said insulated-gate field-effect transistor, said inverter being connected between said first and second power supply terminals, and said capacitor being connected between said output node of said differential comparator and a gate of said third bipolar transistor.

2. A logic level converter circuit according to claim 1, in which said first and second power supply terminals are of a higher voltage and a lower voltage, respectively, said insulated-gate field-effect transistor is a P-channel MOS field-effect transistor and said first through third bipolar transistors are NPN-type bipolar transistors.

3. A logic level converter circuit according to claim 1, further comprising a bias voltage generating circuit connected to the base of said third bipolar transistor for supplying a predetermined bias voltage thereto.

4. A logic level converter circuit according to claim 3, in which said bias voltage generating circuit includes a load resistor and a fourth bipolar transistor having a collector connected to said first power supply terminal, a gate receiving a reference voltage, and an emitter connected to said second power supply terminal through said load resistor.

5. A logic level converter circuit according to claim 1, further comprising an emitter follower circuit whose input terminal is connected to the output node of said differential comparator and whose output terminal is connected to the gate of said insulated-gate field-effect transistor and coupled to the base of said third bipolar transistor through said capacitor.

6. A logic level converter circuit according to claim 5, in which said emitter follower circuit includes a bipolar transistor having a collector connected to said first power supply terminal, a gate connected to the output node of said differential comparator, and an emitter connected to said second power supply terminal through a constant-current source.

7. A logic level converter circuit according to claim 1, further comprising an emitter follower circuit whose input terminal is connected through said capacitor to the output node of said differential comparator and whose output terminal is connected to the gate of said third bipolar transistor.

8. A level converter circuit according to claim 7, in which said emitter follower circuit is formed by a double-emitter bipolar transistor having a collector connected to said first power supply terminal, a gate connected through said capacitor to the output node of said differential comparator, a first emitter connected to the base of said third bipolar transistor and to the second power supply terminal through a load resistor, and a second emitter connected to a collector of said third bipolar transistor through a resistor for clamping.

* * * * *

UNITED STATES PATENT AND TRADEMARK OFFICE
CERTIFICATE OF CORRECTION

PATENT NO. : 5,218,244
DATED : June 8, 1993
INVENTOR(S) : Jyoji NOKUBO

It is certified that error appears in the above-indentified patent and that said Letters Patent is hereby corrected as shown below:

Col. 3, line 63, delete "80" and insert --30--.

Col. 4, line 3, delete "T1" and insert "V1".

Col. 4, line 55, delete "Q4" and insert --Q3--.

Col. 5, line 12, delete "of" and insert --to--.

Col. 5, line 36, delete "W" and insert --V--.

Col. 6, line 1, delete "5" and insert --6--.

Col. 6, line 16, delete "5" and insert --6--.

Signed and Sealed this

Twenty-ninth Day of March, 1994

Attest:

BRUCE LEHMAN

*Attesting Officer*   *Commissioner of Patents and Trademarks*